United States Patent
Yonekura et al.

(10) Patent No.: US 8,542,474 B2
(45) Date of Patent: Sep. 24, 2013

(54) ELECTROSTATIC CHUCK

(75) Inventors: Hiroshi Yonekura, Nagano (JP);
Akihiro Kuribayashi, Nagano (JP);
Kazuyuki Ogura, Nagano (JP);
Hidehiro Komatsu, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 340 days.

(21) Appl. No.: 12/910,414

(22) Filed: Oct. 22, 2010

(65) Prior Publication Data
US 2011/0096460 A1    Apr. 28, 2011

(30) Foreign Application Priority Data
Oct. 26, 2009    (JP) ................. 2009-245267

(51) Int. Cl.
*H01L 21/683*    (2006.01)
*C23C 16/00*    (2006.01)
*B23B 31/28*    (2006.01)

(52) U.S. Cl.
USPC ................ 361/234; 118/725; 279/128

(58) Field of Classification Search
USPC ................ 361/234; 118/725; 279/128
See application file for complete search history.

(56) References Cited

U.S. PATENT DOCUMENTS

| | | | |
|---|---|---|---|
| 6,256,187 B1 * | 7/2001 | Matsunaga et al. | ........... 361/234 |
| 2005/0215073 A1 | 9/2005 | Nakamura | |
| 2006/0144516 A1 | 7/2006 | Ricci | |
| 2009/0078360 A1 | 3/2009 | Ricci | |

FOREIGN PATENT DOCUMENTS

| | | |
|---|---|---|
| JP | 10-41377 | 2/1998 |
| JP | 2005-277074 A1 | 10/2005 |
| JP | 2008-527694 A1 | 7/2008 |

* cited by examiner

*Primary Examiner* — Scott Bauer
(74) *Attorney, Agent, or Firm* — Kratz, Quintos & Hanson, LLP

(57) ABSTRACT

An electrostatic chuck has a structure in which a heater is sandwiched between a base member and an electrostatic chuck substrate, the heater being bonded to the base member with an adhesive layer interposing therebetween. The adhesive layer interposing between the heater and the base member has a structure in which a first adhesive layer and a second adhesive layer are stacked, the first adhesive layer being formed by curing an adhesive having high thermal conductivity, the second adhesive layer being formed as gel by curing an adhesive having lower viscosity than the adhesive of the first adhesive layer. Preferably, the first and second adhesive layers are both made of a silicone-based resin.

4 Claims, 3 Drawing Sheets

ELECTROSTATIC CHUCK

CROSS-REFERENCE TO RELATED APPLICATION

This application is based upon and claims the benefit of priority of the prior Japanese Patent Application No. 2009-245267, filed on Oct. 26, 2009, the entire contents of which are incorporated herein by reference.

FIELD

The embodiments discussed herein are related to an electrostatic chuck for holding a process object in various processing apparatuses.

BACKGROUND

Dry etching is a known technique for etching an etching object made of a silicon compound such as silicon, silicon dioxide, or silicon nitride, a metal such as aluminum, tungsten, molybdenum, or titanium, or a polymer such as a resist, by use of a plasma etching apparatus, a reactive sputter etching apparatus, or the like. This technique includes various types, such as reactive ion etching (RIE), electron cyclotron resonance (ECR) etching, and downflow etching. Among these types, having characteristics of mass productivity and anisotropic etching which enables fine pattern formation, RIE, RF-bias ECR etching, and the like have conventionally been in wide use in manufacture of semiconductor devices.

In a conventional RIE apparatus, first, a wafer is placed on a radio frequency (RF) electrode installed in a chamber, and the chamber is degassed. A plasma generating gas is then introduced into the chamber, and the chamber is controlled to have a predetermined internal pressure through adjustment of the flow and the exhaust velocity of the gas. Next, a predetermined radio frequency wave is applied to the RF electrode through an RF matching box to generate plasma in the chamber. Then, the wafer is etched by exposing a surface of the wafer to the plasma to react therewith. In this event, a required etching mask (resist) is applied to the surface of the wafer so that only object portions on the wafer are selectively etched. At the time of the etching, the wafer is heated by heat generated from chemical reaction with the plasma and by incident energy of collision of ions in the plasma state, or the like. Since the heat burns the resist on the wafer, the wafer needs to be cooled. Further, since the etching process is easily affected by the temperature, precise control of the wafer temperature is important in fine pattern formation.

For such temperature control, it is necessary to appropriately adjust the temperature of the RF electrode on which the wafer is placed, by using a medium such as cooling water, and also to bring the wafer and the RF electrode into tight contact to each other to increase the thermal conductivity therebetween. For those reasons, conventionally, for efficient temperature control of the wafer, an electrostatic chuck (substrate) is provided on the RF electrode, and the wafer is brought into tight contact with the electrostatic chuck so that the contact area may be increased for a thermal contact.

In recent wafer processes, since fine temperature control during the processes is very significant, using an electrostatic chuck equipped with a heater has become mainstream. Such a heater-equipped electrostatic chuck generally has a structure in which a film heater is sandwiched between a metallic base (a base plate which is made of aluminum or the like and inside which a cooling flow channel is provided to pass a cooling medium such as water) and an electrostatic chuck substrate which is made of a ceramic material or the like and in which an electrode layer for electrostatic attraction is embedded. This heater is bonded to the base plate with an adhesive layer interposing therebetween.

The adhesive layer interposing between the heater and the base plate (also referred to as a "heater adhesive layer" below for convenience) needs to be thick enough to even out and stabilize the surface temperature (about 0.5 to 2 mm). When the heater adhesive layer has voids inside, thermal conductivity becomes uneven to cause variation in the temperature distribution in the surface. For this reason, it is important for the adhesive layer not to have voids inside after the heater is bonded to the base plate. Further, since the variation in the surface thickness of the adhesive layer also affects the temperature distribution, the thickness variation needs to be reduced as much as possible.

The conditions for recent wafer processes have become severe. Since the temperature used is high, the heater has high power. To enhance responsiveness and throughput of the temperature control, an improvement in cooling efficiency is necessary. Accordingly, the heater adhesive layer requires a material having high thermal conductivity.

As a technique related to such a conventional art, there is known an apparatus in which a metal plate and a heater are bonded to a top surface of a temperature-controlled mount with a first layer made of an adhesive material interposing therebetween, and a layer made of a dielectric material is then bonded to a top surface of the metal plate with a second layer made of an adhesive material interposing therebetween (for example, Japanese National Publication of International Patent Application No. 2008-527694).

In addition, there is known a technique in which damper layers are provided between a lower insulating layer and a base member of an electrostatic chuck. The damper layers are made of composite materials across which a ratio between a matrix metal and an additive changes such that a thermal expansion rate gradually increases from the lower insulating layer side to the base member side within a predetermined range of the thermal expansion rate of the lower insulating layer and the thermal expansion rate of the base member (for example, Japanese Laid-open Patent Publication No. 10-41377).

Moreover, there is known a technique for a wafer supporting member which includes: a holding part in which one of main surfaces of a plate body serves as a mount surface to mount a wafer; a heater part in which an insulating resin has heaters embedded thereinside and has recessed portions in a surface thereof, and in which a resin having a different composition from the insulating resin is filled to embed the recessed portions; and a conductive base part. The heater part is sandwiched between the holding part and the conductive base part (for example, Japanese Laid-open Patent Publication No. 2005-277074).

As described above, in the conventional heater-equipped electrostatic chuck, the thermal conductivity of the heater adhesive layer interposing between the heater and the base plate needs to be increased, and to that end, an adhesive having high thermal conductivity (typically, a silicone-based resin) has to be used.

However, an adhesive having high thermal conductivity generally has high filler-content percentage and therefore has high viscosity (in the case of a silicone resin, more than 500 P (pores)), and this decreases workability. Specifically, since application of a high-viscosity material with an even thickness is difficult, a problem arises that the work from the application to attachment of the heater to the base plate cannot be carried out smoothly.

In addition, since high viscosity causes poor defoaming performance, there is a problem that voids tend to remain in the heater adhesive layer after cure (after the heater is bonded to the base plate). Further, having a high filler-content percentage and high viscosity, the adhesive increases in hardness after the cure; consequently, stress generated due to thermal stress repeatedly produced while the electrostatic chuck is used cannot be relaxed sufficiently, causing a problem that the heater is peeled off from the adhesive interface (a decrease in the reliability as an electrostatic chuck).

Regarding a method for bonding the heater part to the conductive base part to improve the temperature distribution of a completed electrostatic chuck, JPP No. 2005-277074 given above discloses that the adhesive layer is stacked multiple times, and the heater part and the base part are joined to each other in a reduced pressure atmosphere. However, JP-A 2005-277074 does not particularly mention about using adhesives different in property from each other for the adhesive layer stacked on the heater part and for the adhesive layer for joining the heater part to the base part.

SUMMARY

According to an aspect of the invention, an electrostatic chuck includes a metallic base member, an electrostatic chuck substrate, and a heater provided between the base member and the electrostatic chuck substrate and bonded to the base member with an adhesive layer interposing therebetween, wherein the adhesive layer has a structure in which a first adhesive layer and a second adhesive layer are stacked, the first adhesive layer being formed by curing an adhesive having high thermal conductivity, the second adhesive layer being formed as gel by curing an adhesive having lower viscosity than the adhesive of the first adhesive layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to the attached drawings.

Figure 1:
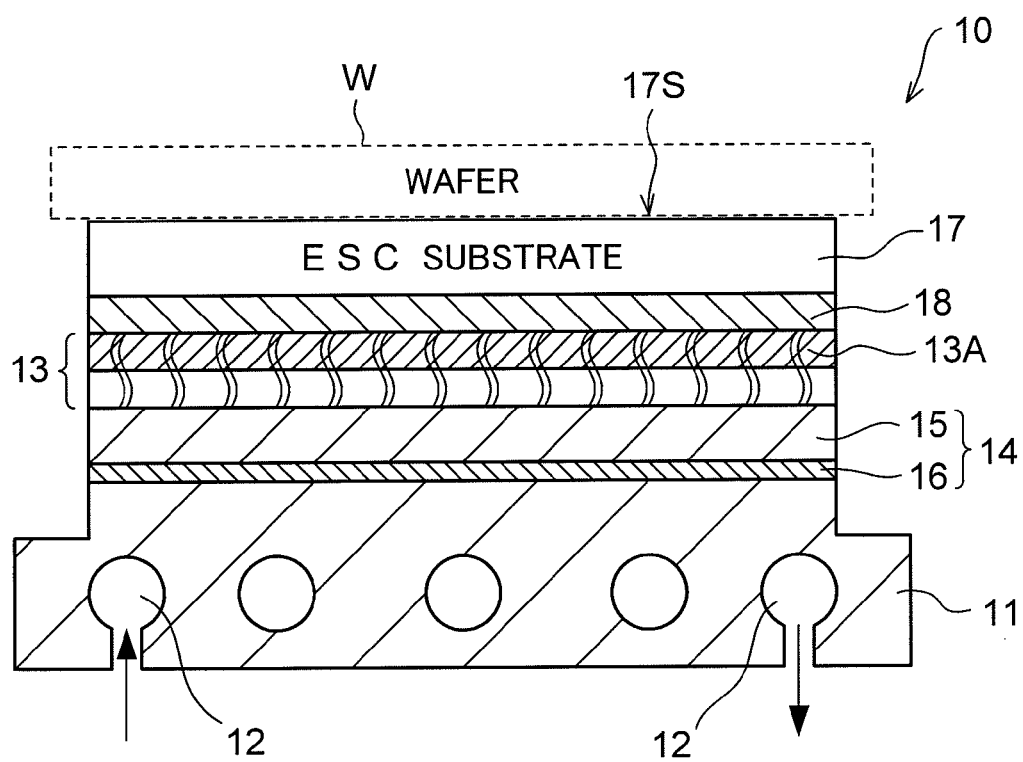
FIG. 1 is a vertical cross-sectional view illustrating the configuration of a heater-equipped electrostatic chuck according to an embodiment.

FIG. 1 is a vertical cross-sectional view illustrating the configuration of a heater-equipped electrostatic chuck according to an embodiment.

A heater-equipped electrostatic chuck 10 according to the present embodiment basically includes a metal base (a base plate) 11, a film heater 13 bonded to the base plate 11 with a heater adhesive layer 14 interposing therebetween, and an electrostatic chuck (ESC) substrate 17 bonded to the heater 13 with a substrate adhesive layer 18 interposing therebetween. A metal plate 13A formed of an aluminum (Al) plate or the like is bonded to a top surface of the heater 13 (the surface to be in contact with the substrate adhesive layer 18) to serve as a soaking plate.

It basically suffices if the base plate 11 is made of a conductive material which is, for example, a metal material such as aluminum (Al) or a carbide, a material combining the metal material and a ceramic material, or the like. In the present embodiment, aluminum (Al) or an alloy thereof having its surface anodized (provided with an insulating layer) is used because of its availability, processability, excellent thermal conductivity, and the like.

Further, as illustrated in FIG. 1, multiple cooling flow channels 12 are formed in parallel in a surface of the base plate 11 in parallel with the heater adhesive layer 14, and are continuous to one another in the base plate 11. The temperature of a wafer W can be adjusted to a predetermined temperature by causing a cooling medium such as water or galden to flow from the leftmost flow channel 12 to the rightmost flow channel 12 as illustrated in the arrows in FIG. 1, the wafer W being held by attraction on the ESC substrate 17 joined onto the base plate 11 with the heater adhesive layer 14, the heater 13 (the soaking plate 13A), and the substrate adhesive layer 18 interposing therebetween.

The base plate 11 can be used as a plasma controlling electrode. To be more specific, a predetermined radio frequency power (usually, multiple radio frequencies) is supplied to the base plate 11 to control energy for colliding generated ion in the plasma state or the like with the wafer W. Thereby, an etching process can be efficiently conducted. Note that the base plate 11 can be used as a plasma generating electrode, as well.

The heater adhesive layer 14 is a member characterizing the present invention, and has a structure in which two layers of different types of adhesives are stacked. In the present embodiment, the heater adhesive layer 14 has a two-layered structure in which a adhesive layer 15 bonded on the heater 13 side and a adhesive layer 16 bonded on the base plate 11 side are stacked.

The thickness of the heater adhesive layer 14 is set to, for example, 0.5 to 2 mm, and the thickness of the adhesive layer 16 is set to about 0.05 to 0.3 mm (preferably about 0.1 mm). Accordingly, the adhesive layer 15 has a thickness equal to what remains after subtracting the thickness of the adhesive layer 16 from the thickness of the heater adhesive layer 14.

The main purpose of providing the adhesive layer 15 is to keep excellent thermal conductivity between the heater 13 and the base plate 11. In other words, the heater 13 is provided to heat the wafer W on the ESC substrate 17, and when the wafer W is heated rapidly by plasma and the like, the heat needs to be let out. Meanwhile, the wafer W needs to be heated while transferring the heat from the heater 13 to the base plate 11. For these reasons, a material selected for the adhesive layer 15 which interposes between the heater 13 and the base plate 11 should desirably have high thermal conductivity. In the present embodiment, a silicone-based resin is used.

As the silicone resin used, one having such characteristics as a pre-cure viscosity of about 100 to 1000 P (pores), a post-cure hardness (Shore hardness) of about Shore A: 50 to 100, and a thermal conductivity of about 2 W/(m·K) is selected.

On the other hand, the adhesive layer 16 constituting part of the heater adhesive layer 14 is provided to relax the stress generated due to thermal stress repeatedly produced while the electrostatic chuck 10 is used. For this reason, a soft material having viscosity at least lower than the adhesive layer 15 is used for the adhesive layer 16 (a stress relaxing layer). In the present embodiment, a silicone gel (obtained by swelling a silicone rubber with a silicone oil) is used.

As the silicone-based resin used, one having such characteristics as a pre-cure viscosity of about 10 to 200 P (pores), becoming gel after cure, and the same thermal conductivity as that of the adhesive layer 15 is selected. The reason that the same high thermal conductivity is required from the adhesive layer 16 is to increase the heat transfer efficiency between the heater 13 and the base plate 11.

The main purpose of providing the substrate adhesive layer 18 which interposes between the heater and the ESC substrate 17 is to keep excellent thermal conductivity between the heater 13 and the ESC substrate 17. Like the adhesive layer 15 of the heater adhesive layer 14, a material having high thermal conductivity (a silicone-based resin) is used for the substrate adhesive layer 18. The thickness of the substrate adhesive layer 18 is set to, for example, about 100 μm.

It basically suffices if the ESC substrate 17 is made of an insulating material: for example, a ceramic material such as alumina, aluminum nitride, or silicon nitride, or an organic material such as a silicone resin or a polyimide resin can be used. In the present embodiment, a ceramic such as alumina or aluminum nitride is used due to such reasons as availability, processability, and relatively high durability against plasma and the like. Having thermal conductivity of as large as 150 to 250 W/(m·K), aluminum nitride is particularly preferable in reducing the temperature difference in the surface of the wafer W held by attraction onto the ESC substrate 17.

The ESC substrate 17 is formed slightly smaller than the wafer W (having a diameter of 300 mm for example) being absorbed thereto. This makes at least an attraction surface 17S not be exposed to plasma. The ESC substrate 17 is formed with a thickness of about 1 to 10 mm for example.

Although not particularly illustrated, a required electrode layer is embedded in the ESC substrate 17. At least, an electrode layer to which a direct-current (DC) voltage for electrostatic attraction is applied is embedded in a portion of the ESC substrate 17 near the attraction surface 17S, which is the side where the wafer W is held. In addition, multiple RF electrode layers to each of which plasma controlling high frequency power is supplied may be embedded as necessary in a portion of the ESC substrate 17 on the opposite side to the attraction surface 17S where the above-mentioned electrode layer for attraction is embedded.

The material of the ESC substrate 17 is ceramic. Thus, tungsten (W), molybdenum (Mo), copper (Cu), or the like is preferably used as a material for the electrode layer embedded in the ESC substrate 17. For example, the ESC substrate 17 can be fabricated as desired by integrally calcinating a ceramic green sheet and ceramic materials sandwiching the ceramic green sheet. Here, the ceramic green sheet is obtained by staking ceramic green sheets to a required thickness, and a required electrode layer is patterned on the ceramic green sheet by a thick film processing.

Next, a method for attaching the heater 13 to the base plate 11 in the heater-equipped electrostatic chuck 10 according to the present embodiment is described with reference to FIGS. 2A to 2D.

Figure 2A:
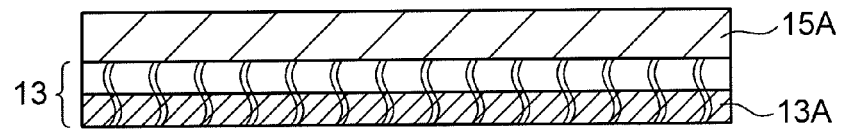
FIGS. 2A to 2D are step diagrams illustrating a method for attaching a heater to a base plate of the electrostatic chuck in FIG. 1.
Figure 2B:
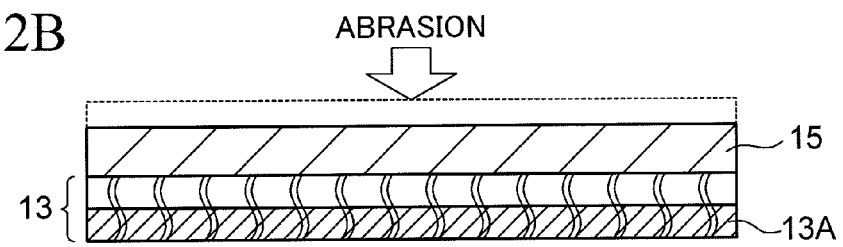
Figure 2C:
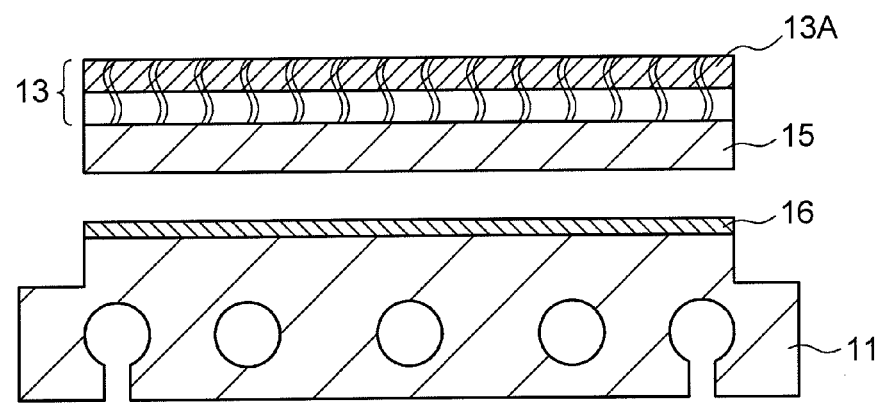

First, the film heater 13 is prepared (see FIG. 2A). For example, first, a heater electrode (a metal wiring) is patterned into a required shape on a polyimide resin film, and then the heater electrode is sandwiched between polyimide resin films. The heater electrode and the polyimide resin films are integrally thermal-cured. Then, the layers thus obtained are attached to the metal plate (soaking plate) 13A formed of an aluminum (Al) plate or the like. In this way, the heater 13 can be obtained as desired. In the preset embodiment, Inconel is used as a metal material for the heater electrode. Inconel is a heat-resistant alloy primarily including nickel (Ni) and about 15 to 23% of chrome (Cr), and may contain iron (Fe), cobalt (Co), or molybdenum (Mo). Inconel has excellent processability, hot and cold workability, and high corrosion resistance.

Next, a silicone resin is applied thickly to one of surfaces of the heater 13 to form the adhesive layer 15A.

After the adhesive layer 15A is cured, the adhesive layer 15A thus cured is subjected to abrasion through chemical mechanical polishing (CMP) or the like, and is thus planarized (see FIG. 2B) to be the adhesive layer 15 having a predetermined thickness.

Next (see FIG. 2C), a silicone gel having viscosity lower than that of the material of the adhesive layer 15 (a silicone resin) is applied, as the adhesive layer 16, to the base plate 11 which has been processed into a required shape in advance. Then the heater 13 is stacked on and attached to the adhesive layer 16, with the surface having the adhesive layer 15 facing down.

Figure 2D:
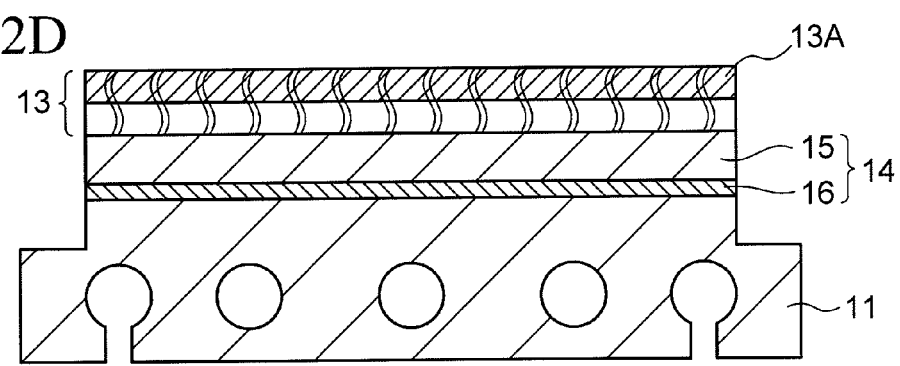

Further, the adhesive layer 16 is cured to be bonded to the adhesive layer 15, and thus the heater adhesive layer 14 is formed (see FIG. 2D). With the steps described so far, a structure in which the heater 13 is bonded to the base plate 11 with the heater adhesive layer 14 interposing therebetween is fabricated.

Further, the electrostatic chuck (ESC) substrate 17 which is made of ceramic such as alumina and in which a required electrode layer (including at least an electrode layer for electrostatic attraction) is embedded is bonded to the above structure by using an adhesive such as a silicone resin (the substrate adhesive layer 18). Thus, the electrostatic chuck 10 according to the present embodiment is obtained.

As described above, in the configuration of the electrostatic chuck 10 (FIG. 1) according to the present embodiment, of the layers constituting the heater adhesive layer 14 having a two-layered structure, the adhesive layer 15 is made of a material having high thermal conductivity, and the adhesive layer 16 becomes gel and soft after cure and therefore functions as a stress relaxing layer. Consequently, the heater adhesive layer 14 overall has high thermal conductivity and is resistant to thermal stress. More specifically, the existence of the adhesive layer 16 (the stress relaxing layer) can relax stress generated due to thermal stress repeatedly produced while the electrostatic chuck 10 is used; therefore, a trouble observed in a conventional technique, such as peeling off of the heater from the bonding interface, can be eliminated. This leads to an improvement in the reliability as the electrostatic chuck 10.

Moreover, since the adhesive layer 16 has low viscosity to allow voids to escape well, it is unnecessary to perform the attachment of the heater (to the base part) in a reduced-pressure atmosphere as described in JP-A 2005-277074 given above. Voids can be removed by performing vacuum defoaming after the heater (as well as the adhesive layer 15) is attached to the base plate 11 with the adhesive layer 16 interposing therebetween. Thus, the steps can be simplified. In other words, workability in the attachment of the heater can be improved.

Further, since the materials used for the adhesive layers 15 and 16 which constitute the heater adhesive layer 14 are both silicone-based resins (one being a silicone resin and the other being a silicone gel) and thus have similar qualities, the adhesive layers 15 and 16 can be bonded to each other with high adhesion. This contributes to an improvement in the reliability as the electrostatic chuck 10.

In the configuration of the electrostatic chuck 10 according to the above-described embodiment (FIG. 1), a case is exemplarily described where the adhesive layer 15 and the adhesive layer 16 (the stress relating layer) constituting the heater adhesive layer 14 are positioned on the heater 13 side and on the base plate 11 side, respectively. However, as is clear from the gist of the present invention (which is, in bonding a heater to a base member using a certain adhesive having high thermal conductivity, to interpose an adhesive having viscosity lower (being softer) than the certain adhesive), the positions (the order) of the adhesive layers 15 and 16 or the number of the layers are of course not limited to what is described in the above example. For example, various modifications as illustrated in FIGS. 3A and 3B are possible.

Figure 3A:
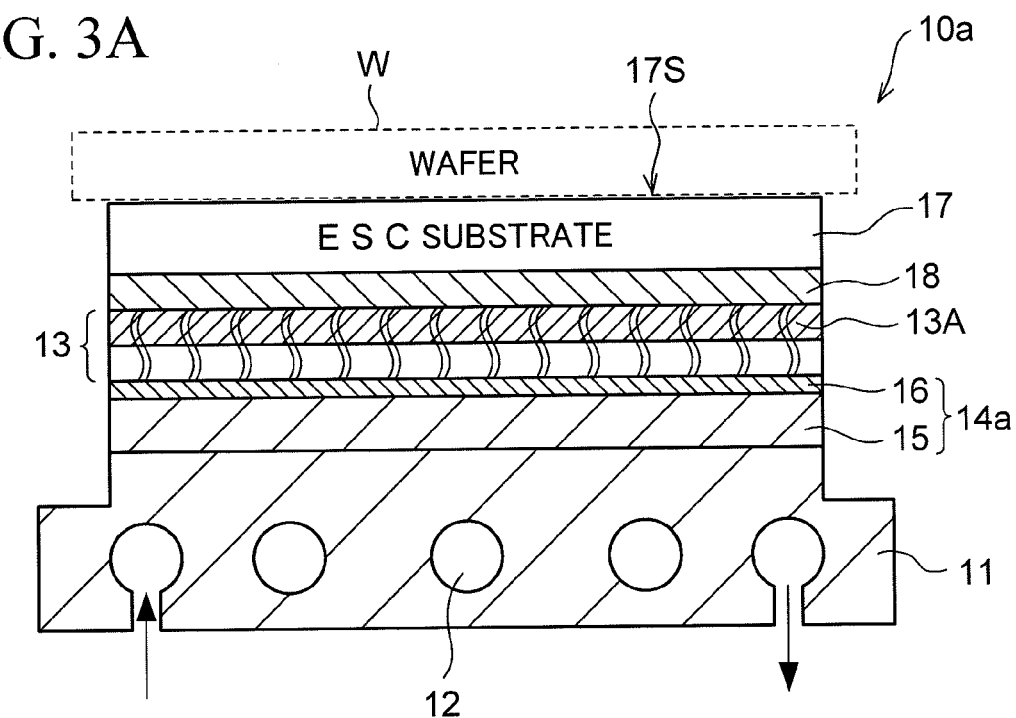
FIGS. 3A and 3B are vertical cross-sectional views each illustrating the configuration of a heater-equipped electrostatic chuck according to a modification of the embodiment in FIG. 1.
Figure 3B:
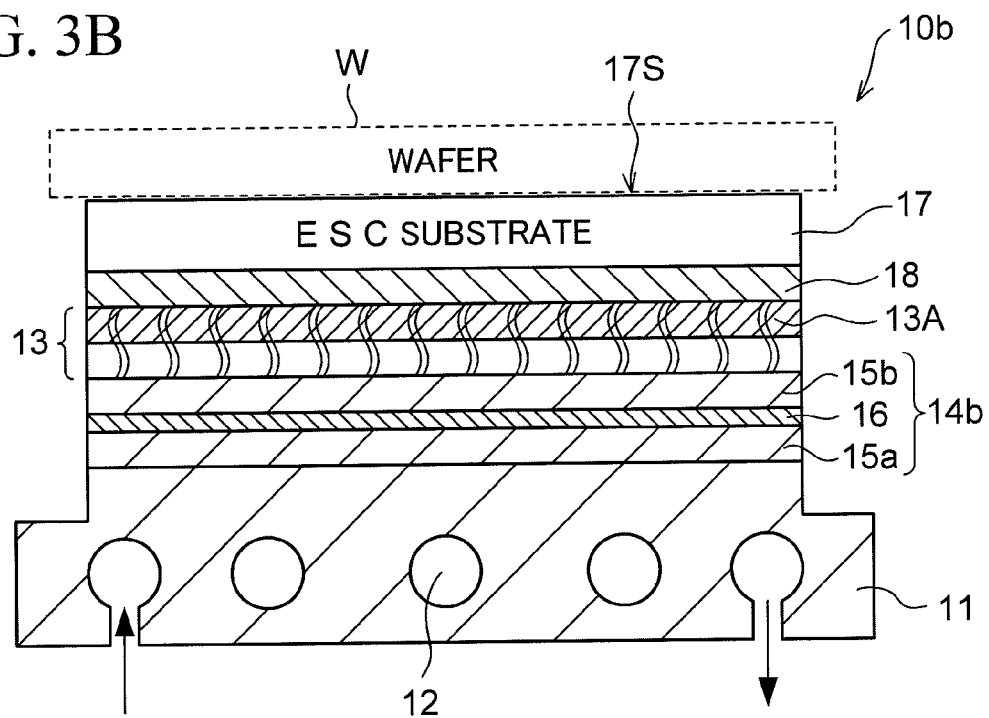

A configuration of an electrostatic chuck 10a illustrated in FIG. 3A is similar to that of the electrostatic chuck 10 according to the embodiment in FIG. 1 in that a heater adhesive layer 14a has a two-layered structure of the adhesive layer 15 and the adhesive layer 16, but is different in that the adhesive layer 15 is bonded on the base plate 11 side and the adhesive layer 16 (stress relaxing layer) is bonded on the heater 13 side, which is inverse of that in the configuration in FIG. 1. Other configurations are the same as those in the embodiment in FIG. 1, and are therefore not described here.

Basically, a method for attaching the heater 13 to the base plate 11 in the electrostatic chuck 10a can be carried out through processing similar to that performed in the steps illustrated in FIGS. 2A to 2D, except that the following points are different. Specifically, in the step of FIG. 2A, the adhesive layer 15A is formed not on the heater 13 but on the base plate 11, and in the step of FIG. 2C, the adhesive layer 16 is applied not to the base plate 11 but to the heater 13.

Like the electrostatic chuck 10 of the embodiment in FIG. 1, the adhesive layer 16 of the electrostatic chuck 10a illustrated in FIG. 3A can function as a stress relaxing layer; accordingly, similar advantageous effects to those produced by the embodiment in FIG. 1 can be obtained.

An electrostatic chuck 10b illustrated in FIG. 3B is different from the configuration of the electrostatic chuck 10 according to the embodiment in FIG. 1 in that a heater adhesive layer 14b interposing between the heater 13 and the base plate 11 has a three-layered structure in which a single adhesive layer 16 (a stress relaxing layer) is sandwiched by two adhesive layers 15a and 15b. Other configurations are the same as those in the embodiment in FIG. 1, and are therefore not described here.

Basically, a method for attaching the heater 13 to the base plate 11 in the electrostatic chuck 10b, too, can be carried out through processing similar to that performed in the steps illustrated in FIGS. 2A to 2D, except that the following points are different. Specifically, the adhesive layer 15a is formed on the base plate 11 as well through processing similar to that performed in the steps in FIGS. 2A and 2B (processing in which the adhesive layer 15b having a predetermined thickness is formed on the heater 13). Moreover, in the step of FIG. 2C, the adhesive layer 16 is applied to the adhesive layer 15a on the base plate 11.

Like the electrostatic chuck 10 of the embodiment in FIG. 1, the adhesive layer 16 of the electrostatic chuck 10b illustrated in FIG. 3B can also function as a stress relaxing layer; accordingly, similar advantageous effects to those produced by the embodiment in FIG. 1 can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrostatic chuck comprising:
a metallic base member;
an electrostatic chuck substrate; and
a heater provided between the base member and the electrostatic chuck substrate and bonded to the base member with an adhesive layer interposing therebetween,
wherein the adhesive layer, having a thickness of 0.5 to 2 mm, has a structure in which a first adhesive layer and a second adhesive layer are stacked, the first adhesive layer being formed by curing an adhesive of a silicone-based resin having high thermal conductivity, the second adhesive layer being formed as a silicone gel, having a thickness of 0.05 to 0.3 mm, by curing an adhesive having lower viscosity than the adhesive of the first adhesive layer.

2. The electrostatic chuck according to claim 1, wherein the first adhesive layer is bonded to the heater, and the second adhesive layer is bonded to the base member.

3. The electrostatic chuck according to claim 1, wherein the first adhesive layer is bonded to the base member, and the second adhesive layer is bonded to the heater.

4. The electrostatic chuck according to claim 1, wherein the adhesive layer has a structure in which the second adhesive layer is sandwiched between the first adhesive layer bonded to the heater and the first adhesive layer bonded to the base member.

* * * * *